(12) United States Patent
Liang

(10) Patent No.: US 8,779,807 B2
(45) Date of Patent: Jul. 15, 2014

(54) METHOD, SYSTEM, AND APPARATUS FOR EFFICIENTLY DRIVING A TRANSISTOR WITH A BOOSTER IN VOLTAGE SUPPLY

(75) Inventor: Yunfeng Liang, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/595,603

(22) Filed: Aug. 27, 2012

(65) Prior Publication Data
US 2014/0055170 A1  Feb. 27, 2014

(51) Int. Cl.
*H03K 3/00*  (2006.01)
(52) U.S. Cl.
USPC ........................................................ 327/109
(58) Field of Classification Search
USPC ........................................................ 327/109
See application file for complete search history.

(56) References Cited

U.S. PATENT DOCUMENTS

| | | | |
|---|---|---|---|
| 7,116,153 B2 | 10/2006 | Pai | |
| 7,233,191 B2 | 6/2007 | Wang et al. | |
| 7,746,156 B1 | 6/2010 | Massie et al. | |
| 8,203,377 B2 | 6/2012 | Kelley et al. | |
| 2003/0048037 A1* | 3/2003 | Boyd | 310/318 |
| 2005/0258458 A1* | 11/2005 | Wang et al. | 257/272 |

OTHER PUBLICATIONS

Round et al., "A SiC JFET Driver for a 5 kW, 150 kHz Three-Phase Sinusoidal-Input, Sinusoidal-Output PWM Converter", available at http://www.pes.ee.ethz.ch/uploads/tx_ethpublications/round_IAS05.pdf, Industry Applications Conference, 2005, 7 pages.

* cited by examiner

*Primary Examiner* — Daniel Rojas

(57) ABSTRACT

A method, system, and apparatus for driving a Silicon Carbide (SiC) Junction Field Effect Transistor (JFET) are provided. A boosting capacitor is used in combination with two drivers to efficiently provide a boosting current to the SiC JFET and then a holding current to the SiC JFET. The boosting capacitor, upon discharge, creates the boosting current and once discharged the holding current is provided by one of the first and second drivers.

20 Claims, 5 Drawing Sheets

METHOD, SYSTEM, AND APPARATUS FOR EFFICIENTLY DRIVING A TRANSISTOR WITH A BOOSTER IN VOLTAGE SUPPLY

FIELD OF THE DISCLOSURE

The present disclosure is generally directed toward driver circuits and specifically directed toward driver circuits for SiC JFETs or any other transistor with similar operational requirements and behaviors.

BACKGROUND

Many types of devices employ Silicon carbide (SiC) Junction Field-Effect Transistors (JFETs). Some areas of application, to name a few, for SiC JFETs include Photo Voltaic (PV) inverters, electrical and hybrid electrical vehicles, downhole drilling, wind turbines, power factor correctors, current/voltage isolators, and the like.

The low on-state losses of SiC JFETs make it possible to either use a transistor with smaller die, thus increasing the effective current density of the system, or to use smaller and lighter cooling equipment. Moreover, the fast switching speed of these JFETs enable the system designer to use a higher switching frequency and reduce the size of the passives, or to reduce the overall switching losses in the system.

One downside to a SiC JFET is that it requires a fairly significant gate current. Indeed, most SiC JFETs require a gate current of at least 5.0 A to initially turn on the device. These devices also require a fairly significant gate current to keep the device turned on. For instance, most SiC JFETs require a hold current in the range of 0.1 A to 1.0 A. The hold current is required due to its inherent Gate-Source diode that limits the applied Gate-Source voltage. The current versus time waveform to drive a typical SiC JFET on and off is shown in FIG. 1. The first time, t1, is typically less than 200 ns and is the duration when I_PEAK is necessary to initially turn on the SiC JFET. The characteristics of a SiC JFET results in a more complex and less efficient gate drive circuit compared to that for a typical Insulated Gate Bipolar Transistor (IGBT), which requires very little current to keep it turned on.

The existing solution to drive a SiC JFET 208, as shown in FIG. 2, typically requires three drivers: 204a, 204b, and 204c. The first driver 204a produces a first output V_HOLD. The second driver 204b produces a second output V_OUTP. The third driver 204c produces a third output V_OUTN. As is typical, the SiC JFET 208 comprises a drain 212, source 216, and gate 220.

An operational state table that depicts the various combination of states for the drivers 204a, 204b, and 204c to produce the waveform of FIG. 1 is shown below.

TABLE 1

State Table for driving solution of FIGS. 1 and 2

|  | S1 | S2 | S3 |
|---|---|---|---|
| SiC JFET on (t1) | On | On | Off |
| SiC JFET on (t2) | On | Off | Off |
| SiC JFET off (t3) | Off | Off | On |

V_HOLD, driven between V_CC2 (often approximately +15V) and V_EE2 (often approximately −15V), is used to provide the holding current I_HOLD to maintain the SiC JFET 208 in its on state during t1 and t2; V_OUTP, driven between V_CC2 (often approximately +15V) and V_E (often approximately 0V), is used to turn on the HD PMOS 224 switch for the duration of t1 to provide the large initial current I_PEAK; V_OUTN, supplied between V_E (often approximately 0V) and V_EE2 (often approximately −15V), is to drive the LD_NMOS 228 to turn the SiC JFET off during t3.

R_3 and R_4 are provided to limit the peak turn-on and turn-off current at the gate 220 of SiC JFET 208. R_HOLD is used to set the holding current, I_HOLD.

The existing solution as depicted in FIGS. 1 and 2 has several disadvantages. First of all, the existing solution is relatively complex. It requires three distinct drivers to operate. A master control signal has to be translated by driver logic into three separate signals S1, S2, and S3, and the on-off timing control among these three signals is essential to prevent any current shoot-through event. The existing solution also requires a t1 timer for S2 to limit the turn-on duration of V_OUTP.

Another significant disadvantage to the existing solution is power inefficiency. I_HOLD needs to be conducting whenever the SiC JFET 208 is on. To minimize the power consumption, V_CC2, the supply to the first driver 204a, needs to be kept as low as just slightly above the threshold voltage of the SiC JFET 208. However, high voltage at V_CC2 is needed for the first driver 204a to develop the high current I_PEAK. The two competing requirements on V_CC2 means that I_HOLD is driven at a voltage higher than its own need. The architecture is inherently not power efficient, unless there is a dedicated voltage source to supply the first driver 204a, but a third power supply means power inefficiency in another way.

SUMMARY

It is, therefore, one aspect of the present disclosure to provide an improved method, system, and device for driving a SiC JFET.

More specifically, it is one aspect of the present disclosure to employ a booster in voltage supply to drive a SiC JFET with higher power efficiency.

In some embodiments, first and second driver are minimally required. The first driver, in some embodiments, can serve as the main SiC JFET driver, and its output drives the gate of the SiC JFET directly or through an optional resistor, which can be used to tune the level of initial turn-on current. The second driver, in some embodiments, serves as the supply booster, and its output is coupled with the voltage supply of the first driver through a capacitor.

In some embodiments, the capacitor corresponds to a boosting capacitor and is used to provide enough current/voltage to turn on the SiC JFET. In a sense, the boosting capacitor acts as a driver for the SiC JFET, but it is a much simpler device than an actual driver. Use of a boosting capacitor greatly simplifies the driver circuit and increases the efficiency with which the SiC JFET is operated. In other words, the boosting capacitor helps provide a substantial charge package to the gate of the SiC JFET to initially turn on the SiC JFET. Once the boosting capacitor has been discharged/depleted, the holding current, I_HOLD for the gate of the SiC JFET can be provided by a single driver.

An advantage to using a boosting capacitor is that a single driver can be used to both boost and hold the SiC JFET in an ON state. Another advantage is that less voltage is required from the voltage supply to operate the SiC JFET, thus, less power is required to start and maintain the SiC JFET in its ON state. Another advantage is that a master control signal is used to directly trigger both the first and second driver; hence there is no need to separately coordinate the on-off control between two drivers. Another advantage is that the duration of the initial turn-on current can be easily adjusted. Another advantage is that there is no need for a third power supply to manage the efficiency of the driver current.

In some embodiments, a driver circuit is provided that generally comprises:

a first driver configured to provide a first output voltage to a gate of a Junction Field Effect Transistor (JFET);

a second driver configured to provide a second output voltage to a boosting capacitor, wherein the boosting capacitor is configured to boost and activate the JFET upon discharge.

The present disclosure will be further understood from the drawings and the following detailed description. Although this description sets forth specific details, it is understood that certain embodiments of the invention may be practiced without these specific details. It is also understood that in some instances, well-known circuits, components and techniques have not been shown in detail in order to avoid obscuring the understanding of the invention.

BRIEF DESCRIPTION OF THE DRAWINGS

The present disclosure is described in conjunction with the appended figures, which are not necessarily drawn to scale.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It is to be understood that various changes may be made in the function and arrangement of elements without departing from the spirit and scope of the appended claims.

Figure 3:
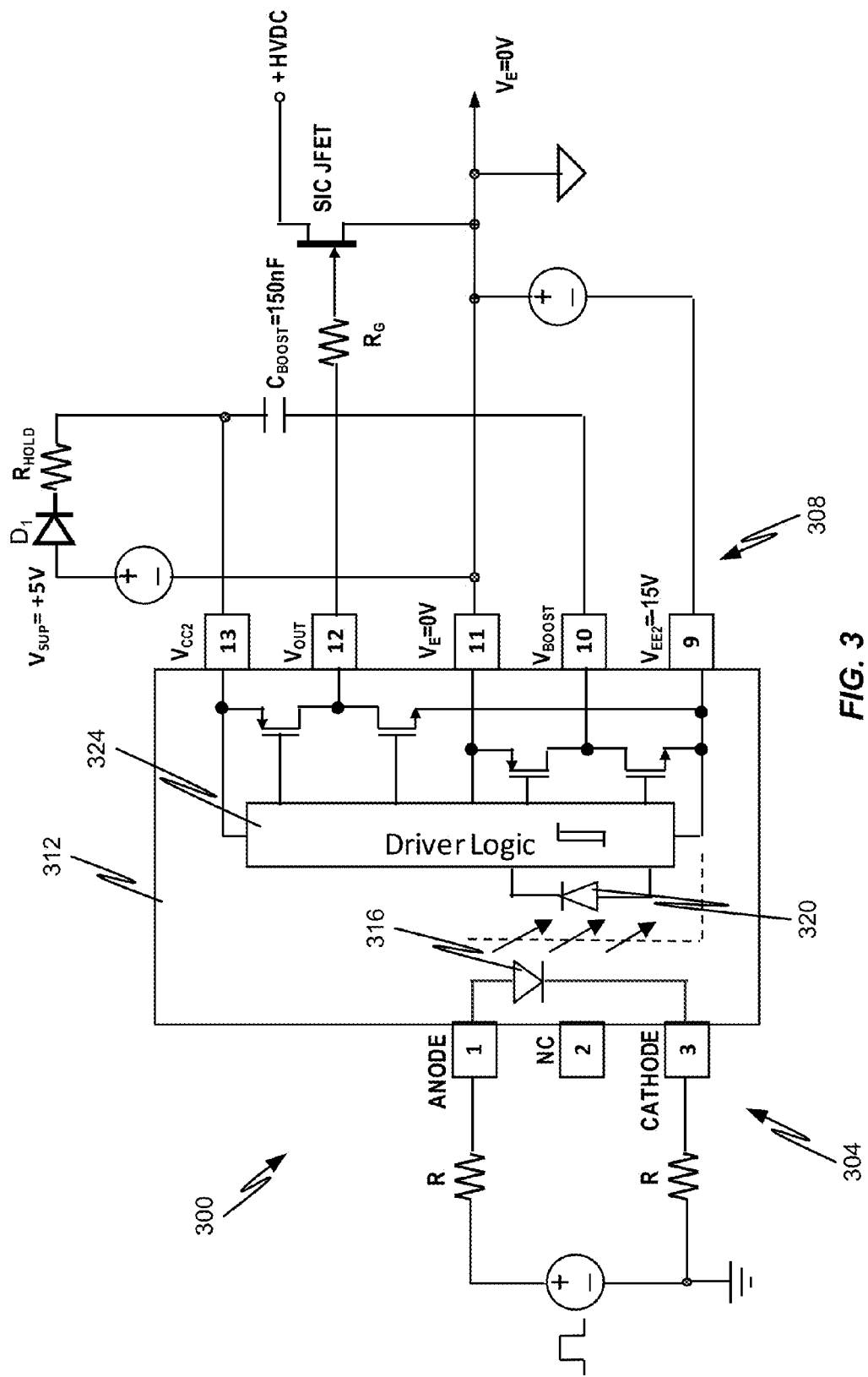
FIG. 3 depicts an application circuit in which a SiC JFET can be incorporated in accordance with embodiments of the present disclosure.
Figure 4A:
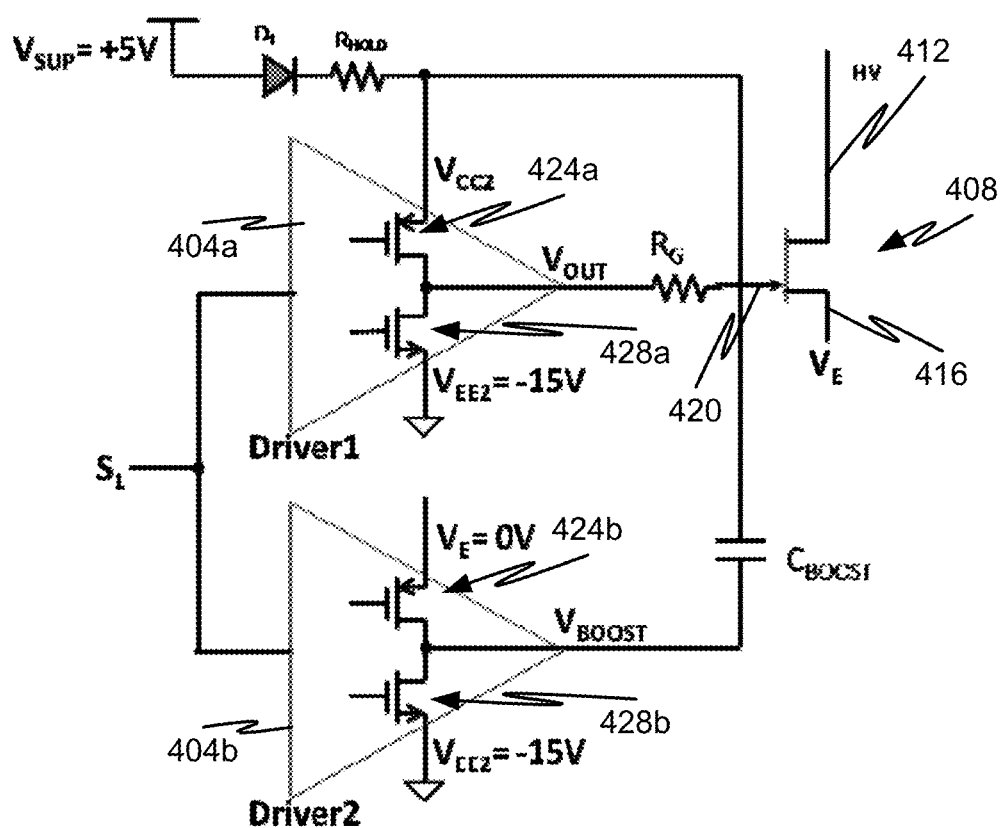
FIG. 4A is a detailed schematic of a driving circuit used to drive a SiC JFET in accordance with embodiments of the present disclosure.
Figure 4B:
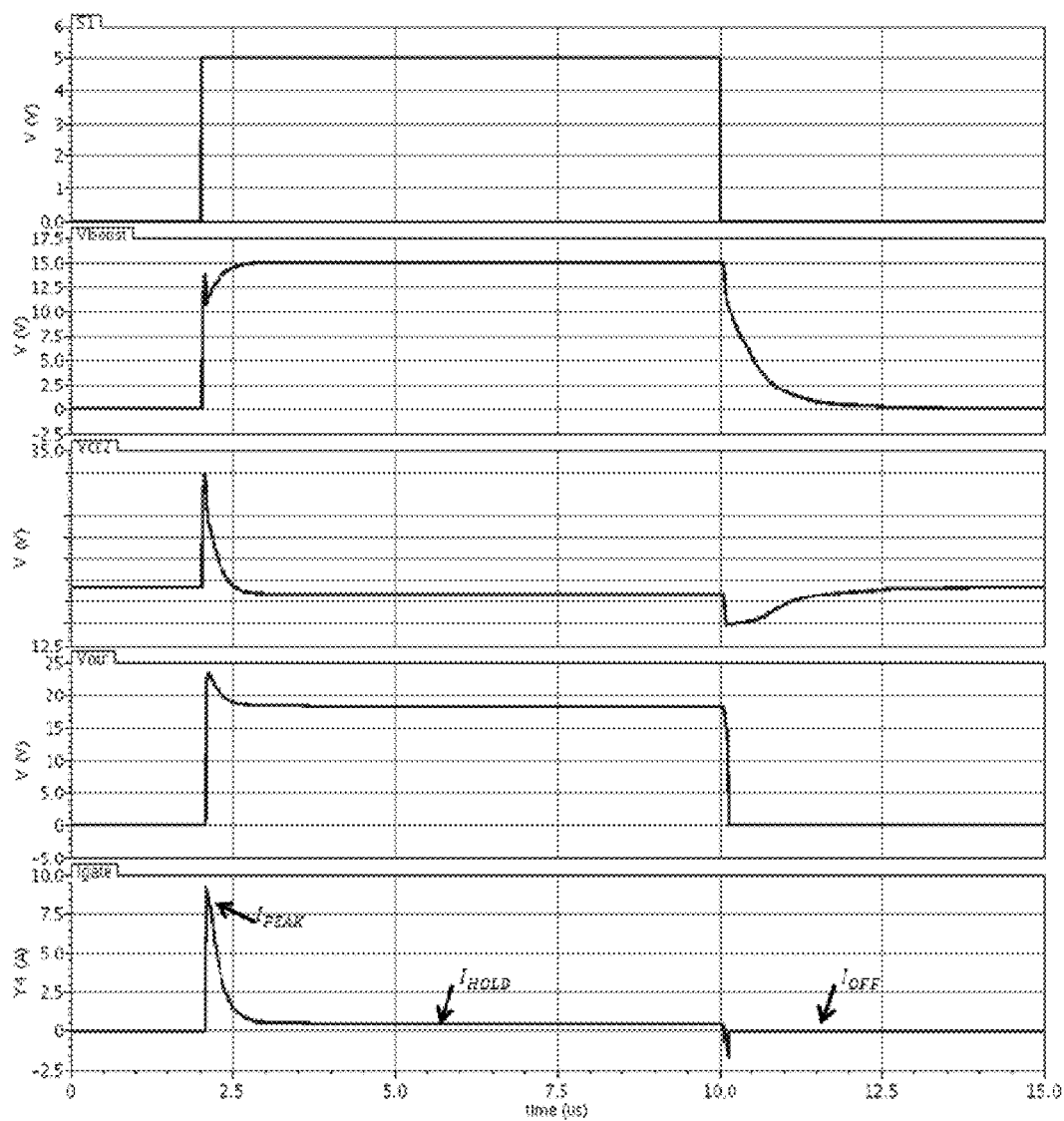
FIG. 4B is a timing diagram of waveforms used to drive a SiC JFET in accordance with embodiments of the present disclosure.

Referring now to FIGS. 3, 4A, and 4B, an improved method, system, and apparatus for driving a SiC JFET will be described in accordance with at least some embodiments of the present disclosure. Although some embodiments will be described in connection with a particular field of application (e.g., a SiC JFET incorporated into an isolator), those of skill in the art will appreciate that embodiments of the present disclosure are not so limited. More explicitly, embodiments of the present disclosure can be employed to drive a SiC JFET or any other type of transistor or circuit element having similar operational requirements/behaviors. Furthermore, the driving concepts disclosed herein can be applied in a number of different fields.

FIG. 3 depicts one example of an application circuit 300 in which a SiC JFET is employed. The application circuit 300 comprises an input side 304, an output side 308, and a coupler 312 connected between the input side 304 and output side 308. In some embodiments, the application circuit 300 corresponds to an isolation circuit where the coupler 312 electrically isolates the input side 304 from the output side 308.

In the depicted example, the coupler 312 corresponds to an optical coupler or opto-coupler. The opto-coupler represents one of many types of isolation devices. The opto-coupler is advantageous for current and voltage isolation due to its high operational efficiencies and small form factor. The depicted opto-coupler 312 comprises a light source 316, a light detector 320, and driver logic 324 electrically connected to the light detector 320.

The light source 316 receives input current from the input side 304. In particular, the input side 304 may correspond to a low-voltage side of the application circuit 300 whereas the output side 308 may correspond to a high-voltage side of the application circuit 300. As an example, the application circuit 300 in which the opto-coupler 312 is employed may be rated to operate at about 5 kV, 10 kV, or more. Stated another way, the input side 304 may operate at voltages of 10V, 1V, 0.1V or less whereas the output side 308 may carry voltages of 5 kV, 10 kV, 15 kV or greater. The opto-coupler 312 enables the two sides of the circuit 300 to operate and communicate with one another without damaging the opto-coupler 312 or any electronic devices attached to the input side 308.

An electrical isolation gap is established between the light source 316 and light detector 320 such that only photonic energy is allowed to traverse the gap. The signals received at the light source 316 are converted into optical energy and transmitted to the light detector 320 across the electrical isolation gap. The light detector 320 receives the optical energy and converts it back into an electrical signal that is provided to the driver logic 324.

Suitable devices that can be used for the light source 316 include, without limitation, a Light Emitting Diode (LED), an array of LEDs, a laser diode, or any other device or collection of devices configured to convert electrical energy into optical energy. The depicted light source 316 corresponds to an LED having its anode in electrical communication with an input PIN1 of the opto-coupler and its cathode in electrical communication with an input PIN3 of the opto-coupler. As voltages are applied across PIN1 and PIN3, the LED is excited and produces optical energy in the form of light (visible, infrared, etc.) that is transmitted across the electrical isolation gap. The anode and cathode of the LED may each be separated from the voltage source by one or more resistors R to ensure that the light source 316 is biased at desired current level.

The light detector 320 corresponds to device or collection of devices configured to convert light or other electromagnetic energy into an electrical signal (e.g., current and/or voltage). Examples of a suitable light detector 320 include, without limitation, a photodiode, a photoresistor, a photovoltaic cell, a phototransistor, an Integrated Circuit (IC) chip comprising one or more photodetector components, or combinations thereof. Similar to the light source 316, the light detector 320 may be configured for surface mounting, thru-hole mounting, or the like.

The light detector 320 may convert the light energy received from the light source 316 into electrical signals that are provided to the driver logic 324. The driver logic 324 may comprise hardware, software, or combinations thereof to convert the signal received from the light detector 320 into control signals that are capable of driving the SiC JFET. More specifically, the driver logic 324 may comprise firmware, an Application Specific Integrated Circuit (ASIC), a Field Programmable Gate Array (FPGA), an analog or digital logic circuit, instructions stored in memory and configured to be executed by a processor or microprocessor, or combinations thereof.

As can be seen in simultaneous reference to FIGS. 3 and 4A, the driver logic 324 may be configured to receive a single input signal from the light detector 320 and based on the single input signal operate a first and second driver 404a, 404b. The first driver 404a may comprise a first PMOS 424a and a first NMOS 428a. In the depicted example, the source of the first PMOS 424a is connected to V_CC2 via PIN13 of the coupler 312. The source of the first NMOS 428a is connected to V_EE2 via PIN9. The drain of the first PMOS 424a is connected to the drain of the first NMOS 428a, both of which are configured to provide V_OUT to the gate 420 of SiC JFET 408 via PIN12. The gate of the first PMOS 424a and the gate of the first NMOS 428a are both connected to the driver logic 324.

The second driver 404b may be similar to the first driver 404a in that the second driver 404b also comprises two MOSFETs. More specifically, the second driver 404b may comprise a second PMOS 424b and a second NMOS 428b. In the depicted example, the source of the second PMOS 424b is connected to V_E (e.g., the source 416 of the SiC JFET 408) via PIN11. The source of the second NMOS 428b is connected to V_EE2 via PIN9. The drain of the second PMOS 424b is connected to the drain of the second NMOS 428b, both of which are configured to provide V_BOOST to the boosting capacitor C_BOOST via PIN10.

As can be seen in FIG. 4A, the output of the first driver 404a (e.g., the drains of the first PMOS 424a and first NMOS 428a) provides V_OUT to the gate 420 of the SiC JFET 408 through a gate resistor R_G. The output of the second driver 404b (e.g., the drains of the second PMOS 424b and the second NMOS 428b) provides V_BOOST to a boosting capacitor C_BOOST. The boosting capacitor C_BOOST is connected between the output of the second driver 404b and the source of the first PMOS 424a. Stated another way, the boosting capacitor C_BOOST is connected between PIN10 and PIN13. A diode D1 and a holding resistor R_HOLD are also connected between V_SUP and the source of the first PMOS 424a. Collectively, the V_SUP and C_BOOST provide V_CC2 to the first driver 404a.

As will be discussed in further detail herein, the boosting capacitor C_BOOST is configured to discharge and temporarily increase the current provided to the source of the first PMOS 424a via V_CC2. The diode D1 blocks the supply voltage V_SUP from the discharge of the boosting capacitor C_BOOST and the holding resistor R_HOLD helps set current provided by the supply voltage V_SUP to the first driver 404a. The second driver 404b provides the boosting voltage V_BOOST to the first driver 404a to turn on the SiC JFET 408 and then the first driver 404a continues to provide a lower current to the gate 420 of the SiC JFET 408 to maintain the SiC JFET 408 in an operational state for a predetermined amount of time.

The SiC JFET 408 is driven by the coordinated efforts of the drivers 404a, 404b and provides an output via its drain 412. More specifically, the SiC JFET 408 provides a high current output from its drain 412. In some embodiments, the SiC JFET 408 is configured to provide outputs of up to 40 A.

Although the figures depicted herein show the drivers 404a, 404b to comprise a specific type of MOSFET (e.g., a single PMOS and single NMOS), those of ordinary skill in the art will appreciate that any type of circuit element or combination of circuit elements may be incorporated into the drivers 404a, 404b to achieve the functions of the PMOS's and NMOS's described herein. For example, the drivers 404a, 404b may comprise two or more MOSFETs of the same or different type (e.g., two or more NMOS's, two or more PMOS's, etc.). The illustrative construction of the drivers 404a, 404b is shown as one of many possible ways that the drivers 404a, 404b can be constructed. It should also be appreciated that the first driver 404a does not necessarily need to comprise the same circuit elements as the second driver 404b.

Operations of the illustrative drivers 404a, 404b will now be discussed with reference to FIGS. 4A and 4B. It should be appreciated that certain voltages described herein (e.g., values of V_EE2, V_SUP, etc.) are only examples and are not intended to limit embodiments of the present disclosure. They are provided for illustrative purposes and can be adjusted to accommodate different types and sizes of SiC JFETs, boosting capacitors, MOSFETs, etc.

During the OFF state, both V_OUT and V_BOOST are off, and the V_GS of the SIC JFET is driven to a negative voltage determined by V_E minus V_EE2. This provides noise immunity to keep the SiC JFET 408 in the OFF state within noisy environments. V_CC2 is supplied by V_SUP through the diode D1 at V_SUP minus V_Diode, and the boosting capacitor C_BOOST is fully refreshed and charged to the following voltage.

$$V\_OFF = V\_SUP - V\_Diode - V\_EE2$$

At the start of ON state (e.g., around 2 us in FIG. 4B), S1 turns on both the first PMOS 424a of the first driver 404a and the second PMOS 424b of the second driver 404b. In response to S1 turning on (e.g., going to a voltage of approximately +5.0V or any other logic supply level that is suited to the circuit's needs), V_OUT begins to rise from V_EE2 to V_CC2. At the same time, the boosting voltage V_BOOST is turned on from V_EE2 to V_E. The step up of 15V (e.g., V_E minus V_EE2) in the boosting voltage V_BOOST pushes V_CC2 higher than V_SUP with the help of the boosting capacitor C_BOOST discharging. During discharge of the boosting capacitor C_BOOST, V_E minus V_EE2 determines the voltage level that is applied to boost the V_CC2 supply (as seen in the spike of V_CC2). The diode D1 blocks the charge stored in the boosting capacitor C_BOOST from leaking back to V_SUP. The stored charge in the boosting capacitor C_BOOST begins to be transferred onto the gate 420 of SiC JFET 408 with conducting PMOS's of the drivers 404a, 404b. This continues until V_CC2 settles to a level lower than V_SUP by a diode voltage drop and the voltage across R_HOLD with I_HOLD current. The voltage generated at V_OUT to turn on the SiC JFET 408 can be expressed according to the following:

$$V\_ON = V\_SUP - V\_Diode - (R\_HOLD \cdot I\_HOLD)$$

This charge transfer current from the boosting capacitor C_BOOST constitutes the initial turn-on peak current I_PEAK. Total transferred charge from the boosting capacitor C_BOOST is expressed according to the following:

$$Q = C\_BOOST \cdot (V\_OFF - V\_ON) = C\_BOOST \cdot (V\_E - V\_EE2 + (R\_HOLD \cdot I\_HOLD))$$

I_PEAK magnitude is mainly limited by the lower of both drivers' 404a, 404b PMOS 424a, 424b driving capability if without a current limiting resistor R_G. The turn-on peak current, I_PEAK, decreases with discharging C_BOOST and hence decreasing V_CC2. Its duration t1 is determined by the time constant of C_BOOST·(R_DSon_424a+

Figure 1:
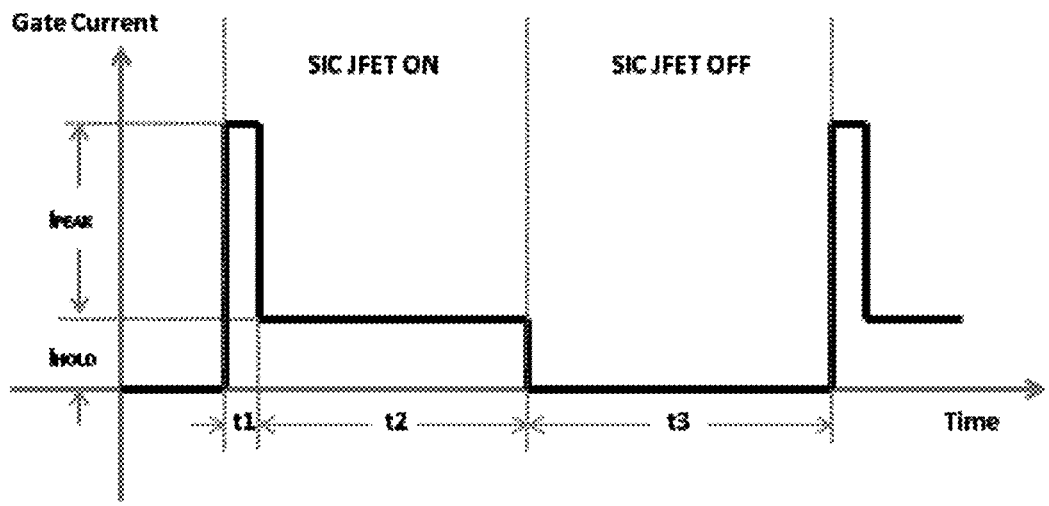
FIG. 1 depicts a timing diagram of gate current used to drive a SiC JFET.
Figure 2:
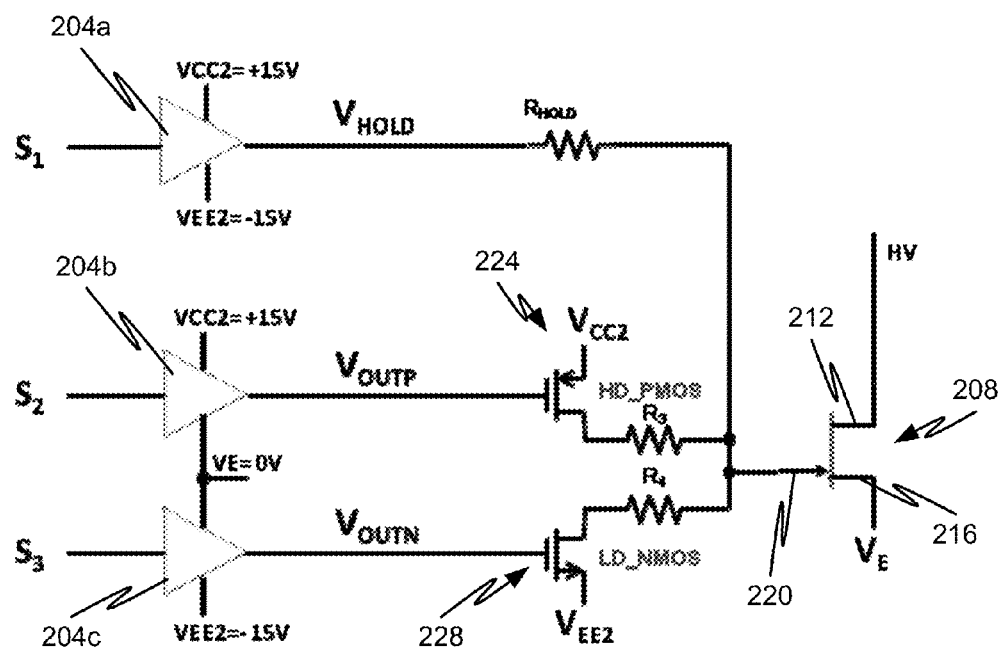
FIG. 2 depicts a driving circuit used to drive a SiC JFET according to the prior art.

R_DSon_424b+R_G), where R_DSon_424a and R_DSon_424b represent the turn-on resistance of PMOS424a and PMOS424b respectively. Hence, t1 in FIG. 1 can be controlled by adjusting the size of the boosting capacitor C_BOOST.

Time constant of C_BOOST·(R_HOLD+R_DSon_428b) determines the approximate time needed to refresh the boosting capacitor C_BOOST within the time frame of t2+t3, where R_DSon_428b represents the turn-on resistance of NMOS428b.

When V_CC2 settles to its final hold level, there is no more current flowing through V_BOOST, and the holding current through V_OUT is expressed according to the following:

$$I\_HOLD=(5-V\_Diode)/(R\_HOLD+R\_DSon\_424a+R\_G)\approx(5-V\_Diode)/R\_HOLD$$

The value of "5" in the above equation is due to the illustrative value of V_SUP and can vary if the value of V_SUP is adjusted. Furthermore, R_DSon_424a represents the turn-on resistance of diodePMOS424a.

With I_HOLD conducting between V_SUP and V_E, this method consumes only the necessary power to hold the SiC JFET 408 in an ON state. Contrasted to the driving methods of the prior art, the above-described method consumes significantly less power and is, therefore, much more efficient and easy to implement. As can be seen in the current vs. time waveform of I_GATE in FIG. 4B, the current provided by the two drivers 404a, 404b approximates or matches the current vs. time waveform depicted in FIG. 1. This means that the driver configuration described herein can provide the necessary operational current to the SiC JFET 408 with only two drivers 404a, 404b rather than the traditional three drivers.

Figure 5:
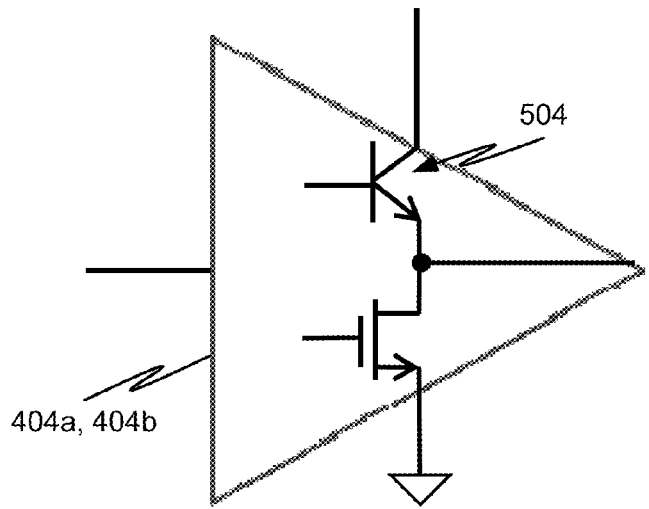
FIG. 5 depicts an alternative arrangement for a driver in accordance with embodiments of the present disclosure.

FIG. 5 shows an alternative arrangement for one or both drivers 404a, 404b. In particular, one or both of drivers 404a, 404b may utilize other types of transistors with low turn-on resistance, such as NPN Bipolar Junction Transistors (BJTs) 504. However, NPN BJTs introduce one Threshold Voltage (VT) or more headroom loss in the supply. This increased headroom loss can be accommodated by raising V_SUP accordingly with consequent higher power consumption, where VT is the BJT threshold voltage.

Figure 6:
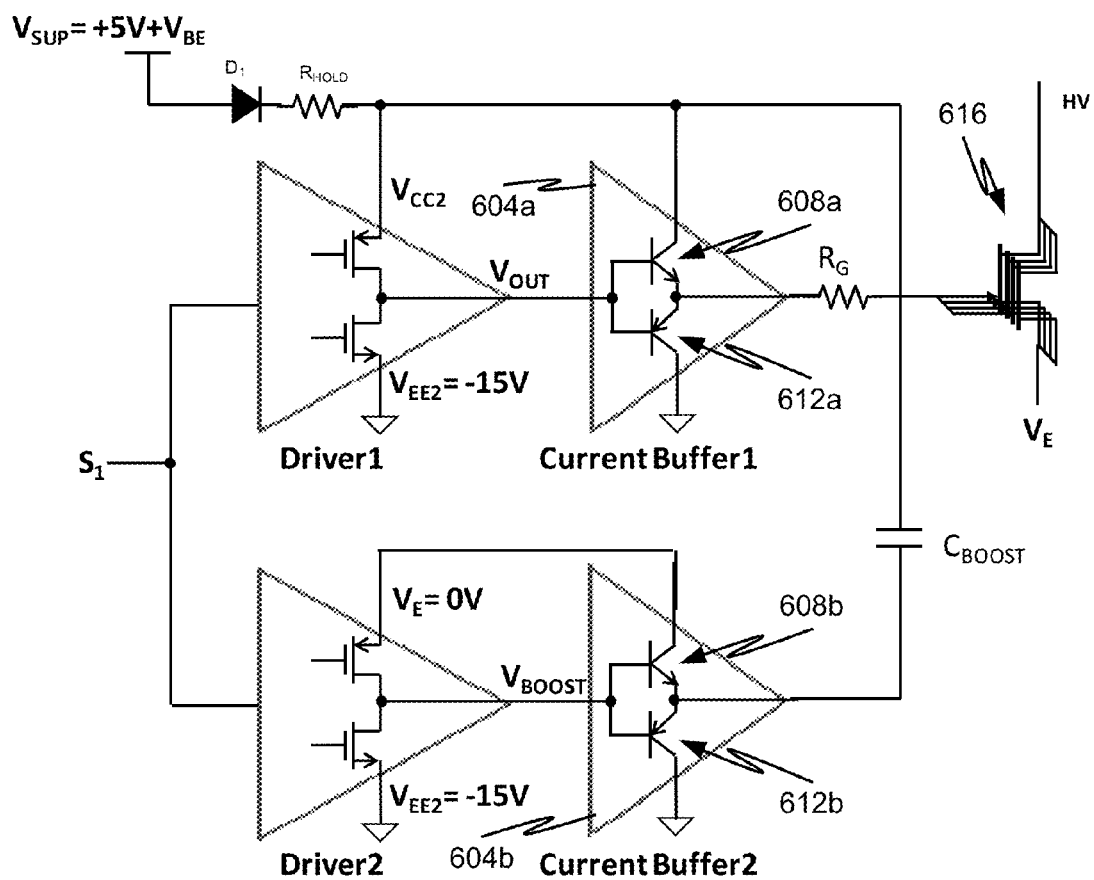
FIG. 6 is a detailed schematic of a driving circuit used to drive a plurality of SiC JFETs in accordance with embodiments of the present disclosure.

FIG. 6 depicts a driving circuit used to drive a plurality of SiC JFETs in accordance with embodiments of the present disclosure. Although many of the embodiments described herein have been related to driving a single SiC JFET, embodiments of the present disclosure are not so limited. As can be seen in FIG. 6, a plurality of SiC JFETs 616 can be driven in parallel. In this scenario, one or more BJT current buffers 604a, 604b may be provided directly at the outputs of drivers 404a, 404b, respectively. Each current buffer 604a, 604b may comprise a first NPN BJT 608a, 608b, respectively, and a second NPN BJT 612a, 612b, respectively. The current buffers 604a, 604b each share the same supply source with its driver 404a, 404b, respectively. Again, the utilization of BJTs introduce one VT or more headroom loss in the supply, and this can be accommodated by raising V_SUP accordingly.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A driver circuit, comprising:
    a first driver configured to provide a first output voltage and first output current to a gate of a Junction Field-Effect Transistor (JFET) for a first amount of time;
    a second driver configured to provide a second output voltage to a boosting capacitor, wherein the boosting capacitor is configured to boost and activate the JFET upon discharge by providing a second output current to the gate of the JFET for a second amount of time that is less than the first amount of time.

2. The driver circuit of claim 1, wherein the JFET is a Silicon Carbide (SiC) JFET that comprises a drain and a source and wherein the drain is configured to provide a high current output while in an ON state.

3. The driver circuit of claim 2, wherein the gate of the SiC JFET is connected to the first driver via a gate resistor and wherein the SiC JFET is configured to be in an ON state after the boosting capacitor has discharged until the first driver is turned off.

4. The driver circuit of claim 1, wherein the first driver comprises at least one transistor having a source, gate, and at least one of a drain and collector and wherein the boosting capacitor is connected between an output of the second driver and at least one terminal of the at least one transistor.

5. The driver circuit of claim 4, wherein the at least one transistor comprises at least one of a P-type MOSFET (PMOS) and an NPN Bipolar Junction Transistor (BJT).

6. The driver circuit of claim 1, wherein the first driver comprises a first P-type MOSFET (PMOS) and a first N-type MOSFET (NMOS) and wherein the second driver comprises a second PMOS and a second NMOS.

7. The driver circuit of claim 6, wherein a drain of the first PMOS is connected to a drain of the first NMOS at an output of the first driver, wherein a drain of the second PMOS is connected to a drain of the second NMOS at an output of the second driver, wherein the output of the second driver is connected to a first side of the boosting capacitor, and wherein a second side of the boosting capacitor is connected to a source of the first PMOS.

8. The driver circuit of claim 7, wherein a source of the first NMOS and a source of the second NMOS are connected to a common voltage and wherein both the first PMOS and the second PMOS are turned on in response to a single input, S1, exceeding a predetermined logic supply level.

9. The driver circuit of claim 1, further comprising:
    driver logic configured to simultaneously control the first and second drivers with only a single input.

10. The driver circuit of claim 9, wherein the driver logic comprises at least one of firmware, an Application Specific Integrated Circuit (ASIC), a Field-Programmable Gate Array (FPGA), an analog circuit element, and a digital circuit element.

11. The driver circuit of claim 1, wherein the first output current is provided to a plurality of JFETs connected in parallel.

12. The driver circuit of claim 11, further comprising at least one current buffer provided between the plurality of JFETs and the output of the first driver.

13. The driver circuit of claim 12, wherein the at least one current buffer comprises a first Bipolar Junction Transistor (BJT) and a second BJT.

14. The driver circuit of claim 13, wherein the first BJT directly receives an output from the first driver and wherein the second BJT directly receives an output from the second driver.

15. The driver circuit of claim 14, wherein the first BJT shares a supply source with the first driver and wherein the second BJT shares a supply source with the second driver.

16. The driver circuit of claim 13, wherein a gate resistor is provided between an output of the first BJT and the boosting capacitor.

17. The driver circuit of claim 9, wherein the driver logic receives an input from a light detector and wherein the input received from the light detector controls operations of the driver logic.

18. The driver circuit of claim 17, wherein the light detector comprises at least one of a photodiode, a photoresistor, a photovoltaic cell, a phototransistor, and an Integrated Circuit (IC) chip comprising one or more photodetector components.

19. The driver circuit of claim 1, further comprising:
   a diode provided between the boosting capacitor and a supply voltage, wherein the diode is configured to block the supply voltage from discharge of the boosting capacitor.

20. The driver circuit of claim 19, further comprising:
   a holding resistor provided between the boosting capacitor and diode, wherein the holding resistor along with the boosting capacitor set current provided by the supply voltage to the first driver.

* * * * *